United States Patent [19]

Zasio et al.

[11] Patent Number: 4,553,236
[45] Date of Patent: Nov. 12, 1985

[54] SYSTEM FOR DETECTING AND CORRECTING ERRORS IN A CMOS COMPUTER SYSTEM

[75] Inventors: John J. Zasio, Sunnyvale; Larry Cooke, Cupertino, both of Calif.

[73] Assignee: Storage Technology Partners, Louisville, Colo.

[21] Appl. No.: 592,125

[22] Filed: Jul. 5, 1984

Related U.S. Application Data

[62] Division of Ser. No. 460,952, Jan. 25, 1983, Pat. No. 4,495,629.

[51] Int. Cl.$^4$ ............................................. G06F 11/26
[52] U.S. Cl. ......................................... 371/15; 371/25
[58] Field of Search ....................... 371/15, 25, 21, 27; 324/73 R, 73 AT

[56] References Cited

U.S. PATENT DOCUMENTS

| | | | |
|---|---|---|---|
| 4,298,980 | 11/1981 | Hajdu et al. ......................... | 371/25 |
| 4,317,200 | 2/1982 | Wakatsuki et al. .................... | 371/25 |
| 4,433,412 | 2/1984 | Best et al. ............................ | 371/25 |
| 4,435,806 | 3/1984 | Segers et al. ......................... | 371/25 |
| 4,476,431 | 10/1984 | Blum .................................... | 371/25 |

Primary Examiner—Michael R. Fleming
Attorney, Agent, or Firm—Bryant R. Gold; James R. Young

[57] ABSTRACT

An improved scannable latch circuit allows its output to be monitored during effectively 100% of the system clock cycle. The circuit further provides dual isolated outputs, one of which is used as a latch output and the other of which is used as a shift-register output. A computer system, in which the scannable latch circuit is used, in conjunction with combinatorial logic and error detection circuitry, may thus monitor the latch output, which is not loaded down by the shift register output, for error detection and other purposes without having to slow down the system operating speed. A preferred embodiment of the scannable latch circuit includes first, second, and third latch elements. When operating a latch circuit, the first latch element operates as the "master" and the second latch element operates as the "slave" of a master/slave latch circuit. When operating as a shift register circuit, shift-in data is coupled to the second latch element, and this second latch element operates as the "master" and the third latch element operates as the "slave" of a master/slave latch through which data is selectively shifted by appropriate clock signals.

4 Claims, 11 Drawing Figures

SYSTEM FOR DETECTING AND CORRECTING ERRORS IN A CMOS COMPUTER SYSTEM

This application is a division, of application Ser. No. 460,952, filed 01/25/83 and now U.S. Pat. No. 4,495,629.

BACKGROUND OF THE INVENTION

This invention relates to the design of circuits for large scale integration (LSI) and very large scale integration (VLSI) circuit chips that use complementary metal oxide semiconductor (CMOS) technology. More particularly, the invention relates to the design of an improved CMOS circuit that combines a latch and shift register so as to remove a timing constraint that has been inherent in previous designs of such circuits.

The central processing unit (CPU) of a large computer system basically consists of latches, combinatorial logic, and a clocking system. The latches are arranged in sets, sometimes called registers, corresponding to the size of the word used within the computer system (a "word" is a prescribed number of bits). Between the sets of latches are combinatorial logic circuits, i.e., logic circuits that do not store data.

At the end of a clock cycle, which is also the beginning of the next clock cycle, the data on the output of the combinatorial logic circuitry is stored in a set of latches. This data appears on the output of the set of latches and therefore on the input of the combinatorial logic circuitry connected to the outputs of the set of latches. This logic circuitry performs the designed logic function on the data and at the end of the clock cycle, the output of the combinatorial logic is stored in the next set of latches. This process is repeated over and over as the computer system operates; that is, data is processed by combinatorial logic cicruitry, stored, passed on to the next set of combinatorial logic circuitry, processed, stored, and so on.

With the advent of LSI and VLSI technologies, computer systems have become physically smaller. However, the availability of large numbers of logic circuits in small packages has allowed computer designers to incorporate features in the computer design that increase the reliability and testability of the system. Such features would have been considered too expensive prior to LSI and VLSI availability.

One of the features that is common in large computer systems today is a "scannable latch." A scannable latch includes a latch that can be converted to a stage of a shift register by the use of appropriate clock signals. The scannable latch further allows the contents of the resulting shift register to be "scanned" by shifting out the contents for examination. The shift register, and therefore the latch, can also be loaded with new contents by shifting new data thereinto.

When the above described latches are incorporated into the design, selected sets may be interconnected to form shift registers. At any time, the correct timing signals can stop the operation of the CPU and shift out the contents of the latches to an operator's computer console for examination; or a known set of data can be shifted into the latches for the computer console. Needless to say, this capability represents a powerful feature for testing a large computer. For example, if it is determined that the floating point division instruction is giving the wrong result, the latches involved can be loaded with a known set of numbers by shifting the known numbers thereinto. The CPU can then be allowed to carry out the calculation one cycle at a time. At the end of each cycle, the contents of the latches can be shifted out and checked. If the latches have the correct result, this result can be shifted back into the latches and the CPU is then allowed to execute the next cycle. This process is continued until an incorrect result is determined. The circuitry responsible for the incorrect result can then be readily found and replaced. In contrast, without this testing feature, isolating the faulty circuitry could be very difficult due to the large amount of circuitry and many clock cycles that are involved in the floating point division calculation.

CMOS VLSI technology allows a general purpose register (GPR) to be fabricated on a single chip. See e.g., copending patent application Ser. No. 468,062, filed Feb. 22, 1983, "Multiport General Purpose CMOS Register", assigned to the same assignee as this application. A GPR, as its name implies, is a general purpose register which can be used, as needed, throughout a CPU for the temporary storage of data. Since the signal chip GPR is relatively inexpensive and occupies a small amount of space, it may now be readily used within large computer systems; whereas before the advent of LSI and VLSI the GPR feature would have been considered too expensive.

A GPR may be used, as explained below, to store the history of the contents of the latches. This history may in turn be used to isolate circuit errors from random errors and perform other error detecting functions. For example, at the end of a clock cycle, when the outputs of the combinatorial logic circuitry are loaded into the latches, some selected set of these outputs may also be loaded into nearby GPR's. Thus, while the contents of the latches change every cycle, the GPR's contain a history of the previous contents of the latches. Further, error detecting logic may be designed into the combinatorial logic circuits, e.g., parity bits may be added to the word, parity generating and checking circuitry may be added to the combinatorial logic, and the outputs from redundant circuits may be added and their outputs checked to see if they are identical.

Hence, using the example of the floating point division instruction given above, if the error detecting circuitry detects an error after the fourth cycle of the calculation, the operation of the CPU can be halted and the data words from the GPRs that were stored four cycles previously may be loaded into the appropriate latches, at which time the CPU may be restarted. If the error was caused by some random failure mechanism, such as a noise pulse on the power distribution system, the second attempt at performing the calculation will be successful. This retry feature adds greatly to the reliability of the system since many of the errors will be random errors, and thus correctable errors.

If, however, the error was caused by a circuit failure, the error will occur again and the appropriate latches can then be scanned by the operator in an attempt to isolate the failing circuitry.

Unfortunately, while the above described error detection method greatly improves the reliability and testability of the computer system, only one half of the clock cycle is typically available to detect such errors. This is explained more fully below, but is basically caused by the fact that the clock signal must be in a prescribed state when the CPU operation is halted. If this time (when the clock is in its prescribed state) is not sufficient to detect the errors, the clock period must be extended, slowing down the operation of the computer system. What is needed, therefore, among other things, is a means for the errors to be detected at any time during the clock cycle, thereby preventing the operating speed of the computer system from being slowed down at the cost of reliability.

SUMMARY OF THE INVENTION

Accordingly, it is an object of the present invention to provide a computer system that provides error detection and correction capability without sacrificing operating speed.

A further object of the present invention is to provide a CMOS scannable latch that is not a limiting factor in the operating speed of the computer system in which the latch is used.

More particularly, it is an object of the present invention to provide such a CMOS scannable latch wherein the latch output may be monitored for errors during the entire clock cycle.

The above and other objects of the present invention are realized by a unique combination of desired features that are incorporated into a CMOS scannable latch design. Advantageously, for example, the invention uses the same clock signal, and its complement, to control the operation of both the master and slave sections of the latch. This ensures that both can be driven by the same local clock drivers, thereby eliminating any clock skew. Further, a chopped clock signal, instead of a square wave, is used to provide additional time for the error detecting circuitry to perform its assigned task. Finally, a separate stage is used for the shift-out section. In contrast, prior art designs have used the slave section of the latch as the shift-out section, but doing so slows the operation of the latch because of the presence of the electrical load of the next shift-in section.

The combination of the above described features provides a scannable latch circuit suitable for use in high speed computer systems. Advantageously, when such a scannable latch is used, the cycle time of the computer system is determined by the circuit delays of the combinatorial logic, wiring delays, package delays, etc., and is not limited by the scannable latch.

BRIEF DESCRIPTION OF THE DRAWINGS

The above and other objects, features, and advantages of the present invention will be more apparent from the following more particular description, presented in connection with the accompanying drawings, wherein.

DETAILED DESCRIPTION OF THE INVENTION

The following is a description of the best contemplated mode of carrying out the invention. This description is given only for the purpose of describing the general principles of the invention and is not to be taken in a limiting sense. The true scope of the invention should be determined with reference to the appended claims.

In order to appreciate and better understand the present invention, prior art latch circuits and prior art combination latch and shift register circuits will first be discussed in conjunction with FIGS. 1a and 2a.

Figure 1A:
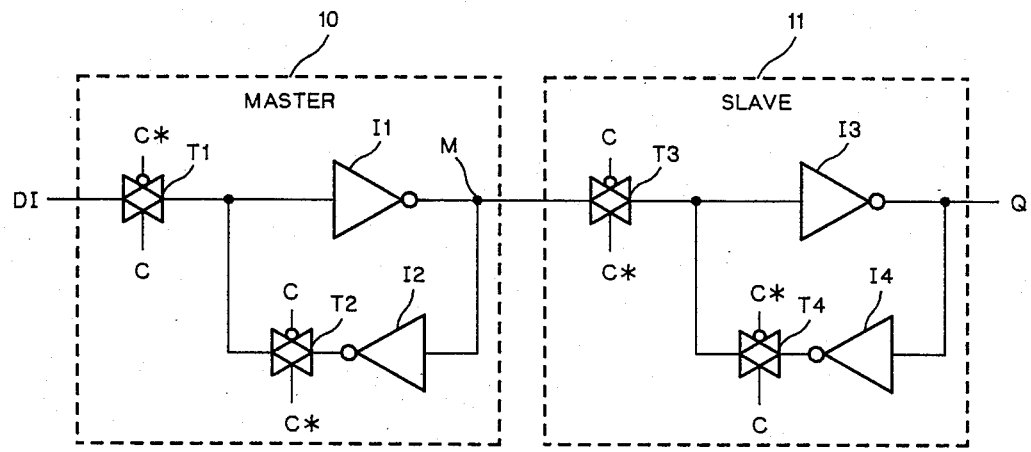
FIGS. 1a and 1b are respectively a logic drawing and a timing diagram for a typical CMOS latch circuit.

FIG. 1a is a logic drawing of a typical latch used in CMOS LSI and VLSI chips. The latch consists of two sections, the master section 10 and slave section 11. Each stage consists of two transmission gates, labeled with a T and a number, such as T1, T2, . . . . , and two inverters, labeled with an I and a number, such as I1, I2, . . . .

A transmission gate is a circuit that is turned on when the signal on the control input that is shown as a small circle is low, and turned off when the signal on that control input is high. When the transmission gate is turned on, the gate functions as a closed switch and a signal may pass therethrough. When the transmission gate is turned off, it functions as an open switch and a signal is blocked from passing therethrough. In the figures, the signal C is the clock signal, while the signal C* is the complement of the clock signal. Thus, C and C* always have opposite logic values; when C is high, C* is low, and vice-versa.

An inverter is a circuit whose output always has the opposite polarity of the input.

The latch of FIG. 1a functions in the following manner: When the clock signal C is high, C* is low, and transmission gates T1 and T4 are turned on while transmission gates T2 and T3 are turned off. The data-in signal, DI, is passed through T1, inverted by I1, re-inverted to its original polarity by I2, but is blocked by T2. The output of I1 is also blocked by T3. When the clock signal reverses polarity, C is low, C* is high, and transmission gates T1 and T4 are turned off while gates T2 and T3 are turned on. The signal on the output of I2 (the same logic signal as DI) is thus applied to the input of I1. This "latches" the input signal into the master section 10 of the latch since the signal will circulate through the loop formed by I1 and I2.

At the same time, transmission gate T3 is turned on, and the input signal DI, after a double inversion by I1 and I3, appears on the output as the signal Q. When the clock signal goes high again, C is high, C* is low and the transmission gates of the latch are back to their original condition. Since T3 is turned off and T4 is turned on, the input signal is now latched in the slave section 11 of the latch.

Figure 1B:
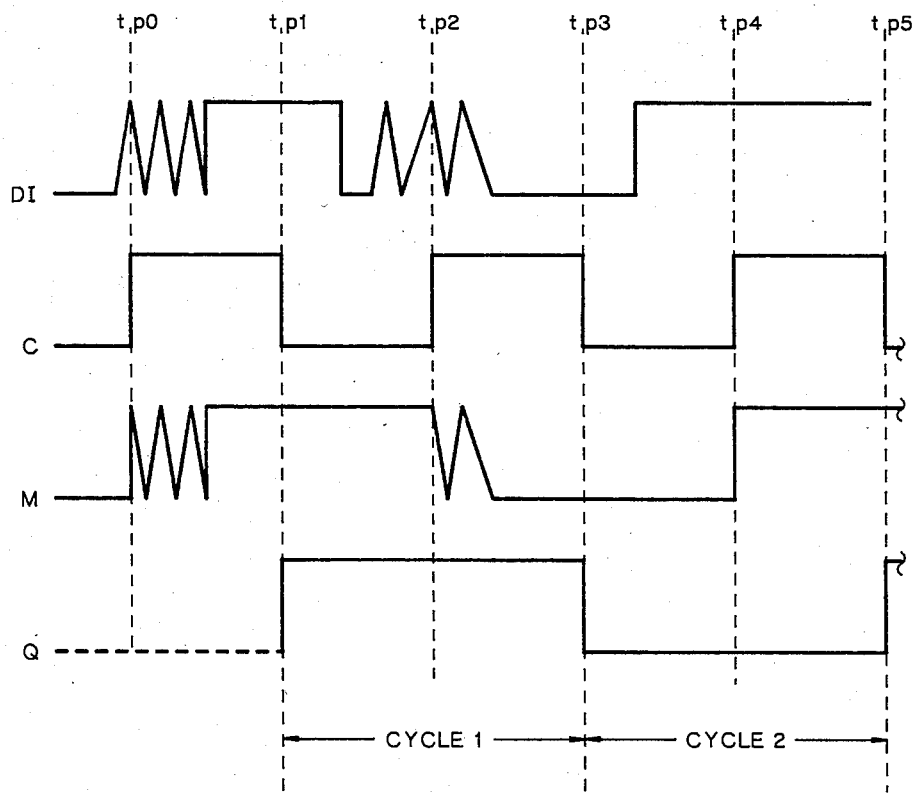

FIG. 1b is a timing diagram for the latch of FIG. 1a, showing the signal DI, the clock signal C, the output M of the master section 10, and the output Q of the slave section 11. The input signal is shown for illustrative purposes, with several sharp peaks (which peaks are generally not characteristic of logic signals). However, the peaks could represent noise or other undesirable discontinuities appearing on the data signal; and, if for no other reason, the peaks effectively illustrate when the output M is connected to the input DI and when it is not. Circuit delays are not shown in FIG. 1b in order to make the timing diagram easier to understand.

Still referring to FIG. 1b, it is seen that during a first clock sub-cycle, that is between times tp0 and tp1, the clock signal C is high, T1 is turned on, and the output M of the master section of the latch 10 follows the input signal DI. At time tp1, at the begining of the next clock sub-cycle, the input signal DI latches in to the master section 10 of the latch and, since T3 is turned on, passes on to the output Q of the slave section 11. During the clock sub-cycle defined between tp1 and tp2, the output M of the master section 10 is not affected by changes in DI since T1 is turned off and the output Q of the slave section 11 remains constant. At tp2, the contents of the master section 10 are latched in the slave section 11. The clock sub-cycle between tp2 and tp3 is similar to that between tp0 and tp1 and the output M of the master section 10 will again follow the input signal DI.

As shown in FIG. 1b, a clock cycle is defined as the time between the falling edges of the clock signal C, e.g., tp1 to tp3, tp3 to tp5, etc. The master-slave latch ensures that the output Q of the latch will be constant during the entire cycle, unaffected by changes on the input, and will have the same logic level the input had just prior to the start of the cycle.

Figure 2A:
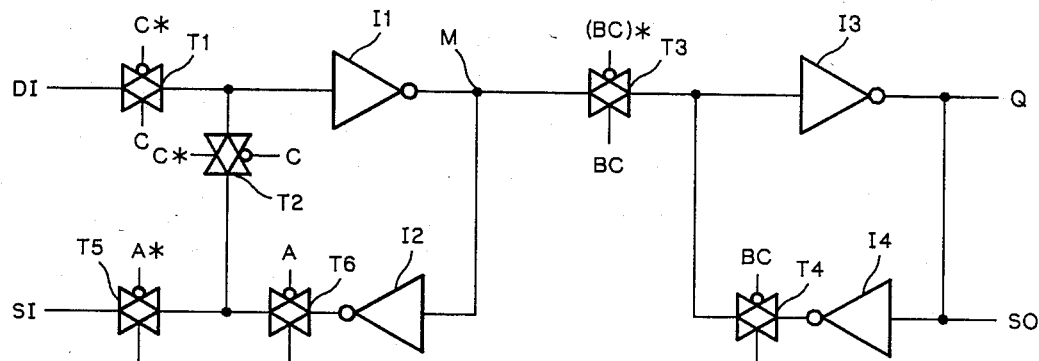
FIGS. 2a, 2b, and 2c show respectively a logic drawing of a combination CMOS latch/shift register circuit, a clock decoding circuit required for the latch/shift register circuit, and the applicable timing diagram.
Figure 2B:
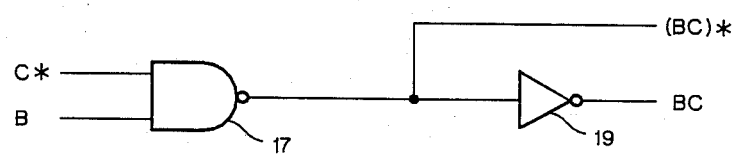

FIG. 2a shows how the latch of FIG. 1a can be converted to a combination latch and shift register stage by the addition of two transmission gates, T5 and T6. Three different clock signals A, B, and C are used to control the operation of the circuit. Each of these clock signals could be derived from a master clock signal according to well known techniques by those skilled in the art. Additional circuitry, shown in FIG. 2b, is required to gate the clock signal.

When the circuit of FIG. 2a is used as a latch, the clock signal A is held low and the clock signal B is held high. The two input NAND gate 17 (FIG. 2b) is enabled by the high level signal B and the clock signal C* and generates the signals (BC)* and, through the inverter 19, its complement BC. These two signals are in phase with the clock signals C and C*, respectively. Since A is low, and therefore A* is high, transmission gate T5 (see FIG. 2a) is turned off and T6 is turned on and the circuit is controlled by the clock signal C as discussed in the description of FIG. 1.

When the circuit of FIG. 2a is used as a shift register stage, the clock signal C is held low. The two input NAND gate 17 is enabled by the high level signal C*. The clock signal B generates the signal (BC)* and, through the inverter 19, its complement BC. The signals BC and (BC)* are in phase with the signal B and B*, respectively.

Figure 2C:
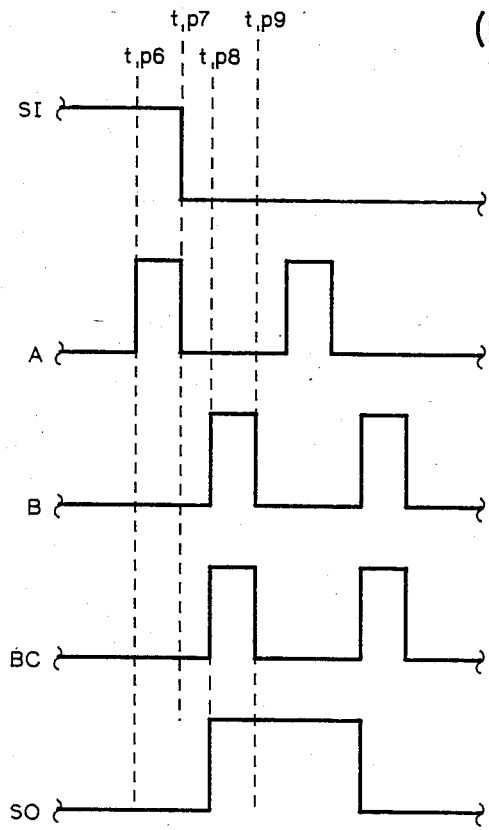

FIG. 2c shows the timing diagram for the circuit of FIG. 2a when functioning as a shift register stage. At time tp6, T5 is turned on and the shift-in signal, SI, from the previous stage of the shift register, is inverted by I1. At time tp7, the signal SI is latched by the master section. At time tp8, T3 is turned on by the signal (BC)* and the signal SI appears at the shift-out output, SO. At time tp9, the slave section latches the input signal SI.

Thus, as described above, the clock signal A controls the operation of the master section and clock signal B controls the operation of the slave section when the circuit is being used as a shift register. The two clock signals A and B are shown "chopped", which is explained below.

The prior art circuit of FIG. 2a has two inherent drawbacks: (1) The circuit of FIG. 2b causes a skew between the clock signal C, which controls the master section when the circuit is used as a latch, and the clock signal BC, which controls the slave section. This means that T3 will not turn off at precisely the same time as T1 turns on. Therefore, the input signal DI might momentarily appear on the output and might be interpreted as a real signal by the combinatorial logic circuitry connected to the output. (2) The shift register output SO, and the latch output Q, are the same point. The wiring required to connect SO to the next input SI may be relatively long and load down the circuit connected to Q.

Both of the prior art problems described above can be alleviated by slowing down the clock C. However, slowing down the clock C directly impacts the cycle time of the system wherein the scannable latch is used, and therefore disadvantageously slows down the entire operating speed of the system.

Figure 3:
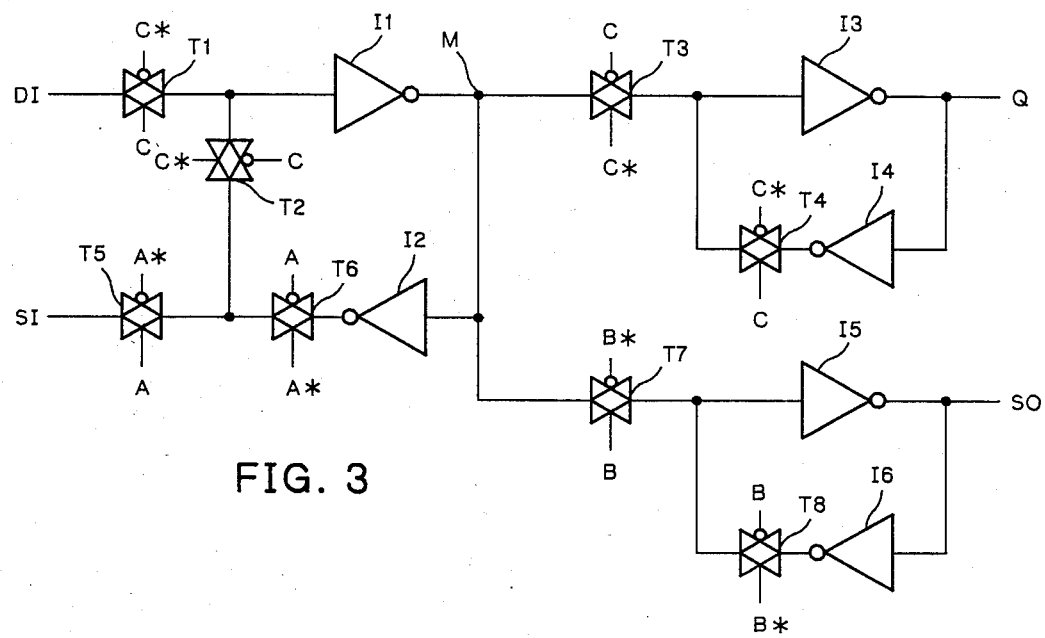
FIG. 3 is a logic drawing of an improved combination latch/shift register circuit.

FIG. 3 shows a logic drawing of a combination latch/shift register circuit design which solves both of the defects associated with the circuit of FIG. 2a. The circuit of FIG. 3 is controlled directly by the clock signals A, B, and C and the circuitry of FIG. 2b is not required, thus solving the skew problem of FIG. 2.

In FIG. 3, when the circuit is used as a latch, the clock signals A and B are held low and transmission gate T5 is turned off and T6 is turned on. The master section of the latch, T1, I1, T2 and I2, and the slave section T3, I3, T4 and I4, operate under the control of the clock signal C as discussed in the description of FIG. 1. The timing diagram of FIG. 2c, with the signal B being used instead of BC, also applies to FIG. 3 when the circuit of FIG. 3 is being used as a shift register stage. The circuit of FIG. 3 functions as discussed in the shift register description of FIG. 2 except that the circuit of FIG. 3 has a separate slave section, T7, I5, T8 and I6. Thus, the output, SO, does not load down the circuit connected to Q.

Figure 4:
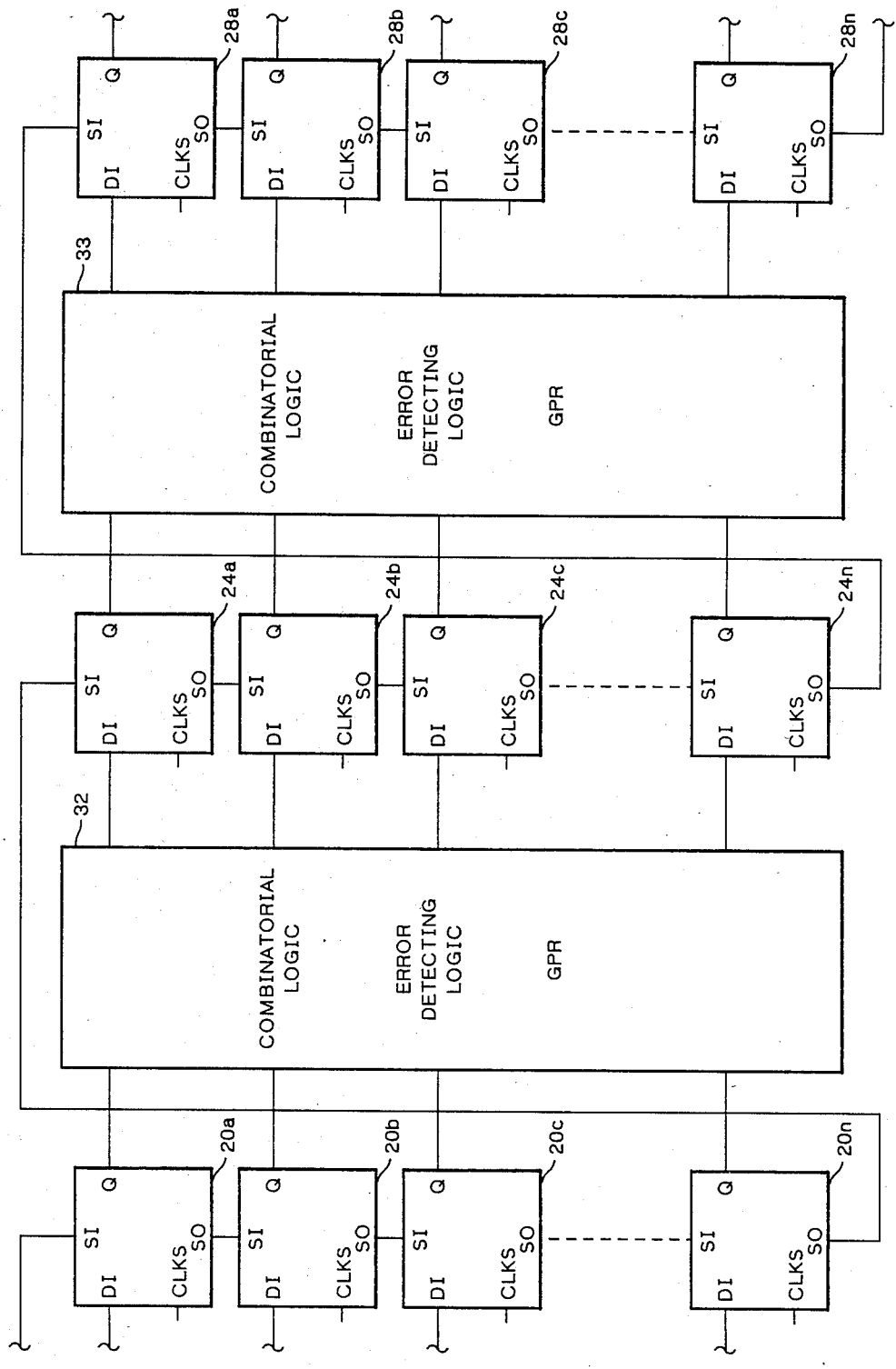
FIG. 4 illustrates the use of combination latch/shift register circuits in the architecture of a modern computer system.

FIG. 4 illustrates how the combination latch/shift register of the present invention may be used in a CPU. Three sets of latches 20a . . . 20n, 24a . . . 24n, and 28a . . . 28n are shown. The SO output of each latch is connected to the SI input of the next latch such that all the latches shown form a single shift register. The various clock inputs of each latch are shown on each latch set 20, 24, and 28 as a single input labeled CLKS.

Between the sets of latches are blocks 32 and 33, representing the combinatorial logic circuits and error detecting logic circuits. Also included in the blocks 32 and 33 are general purpose registers (GPR), indicating that the outputs of some of the latches are also stored in a GPR. Thus, as explained previously, data may be latched into the latches 20 at the end of one cycle, appear at the outputs Q, pass through combinatorial logic circuits and error detection logic circuits 32, which may or may not include a GPR, and be latched into other latches 24 at the end of the clock cycle.

When an error is detected, the CPU clock is stopped and one of two courses may be taken:

1. The CPU can be "backed-up" and restarted. This is done by loading the affected latches with data stored in the GRP's that occurred the appropriate number of cycles ago (the mechanism for doing this is not shown in FIG. 4), and then retrying the sequence that caused the error. If the error was caused by an intermittent problem, the retry should be successful. On the other hand, if the error was caused by a hardware failure, it will reoccur.

2. The latch/shift register circuit can be used as a shift register and the data which caused the error can be shifted out to the console CPU. The data can be stored by the console CPU and also shifted back into the latches and the CPU can be allowed to execute one more cycle, repeating the error. The data in the latches, which includes the error, can then be shifted out to the console CPU. The data before and after the operation which caused the error is now known, as well as the operation that was performed when the error occurred, and attempts can be made to isolate the cause of the error.

If either the circuits of FIG. 2 or 3 are used for the latches 20, 24, and 28 of FIG. 4, and if the clock signal C (FIG. 1b) is used to control these latches, a serious time constraint is imposed upon the CPU design. To explain, referring to FIG. 1b, the clock sub-cycle time between tp1 and tp2 is the time that the combinatorial logic circuitry is processing the data and the time the error detecting circuitry is checking for errors. At time tp1, the data is latched into the master section of the latch and appears on the output Q of the latch. At time tp2, the data is latched into the slave section of the latch. If the error is detected between clock sub-cycle time tp2 and tp3, transmission gate T1 is turned on and the output M of the master section is following the input DI. When the clock C is stopped, the clock will go to a low level, and the slave section will latch whatever logic level is on its input. Thus, the contents of the slave section that were present at the start of the cycle may be modified.

One way to avoid the above-described problem is to make the clock cycle longer so that the error detecting logic will be able to detect an error while the clock C is low, i.e., during the clock sub-cycle time defined between tp1 and tp2. However, as explained previously, it is desirable to operate a computer system at the highest speed possible to gain the maximum efficiency. Therefore, the cycle time is designed to be the minimum time that will allow the slowest set of combinatorial logic circuitry to function.

Figure 5A:
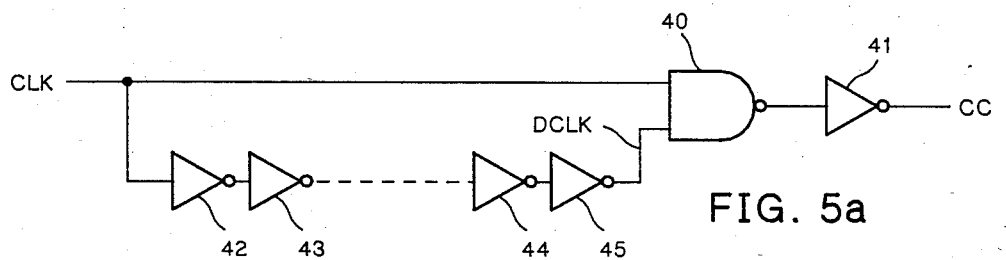
FIGS. 5a and 5b are respectively the logic drawing and timing diagram for a clock chopping circuit.
Figure 5B:
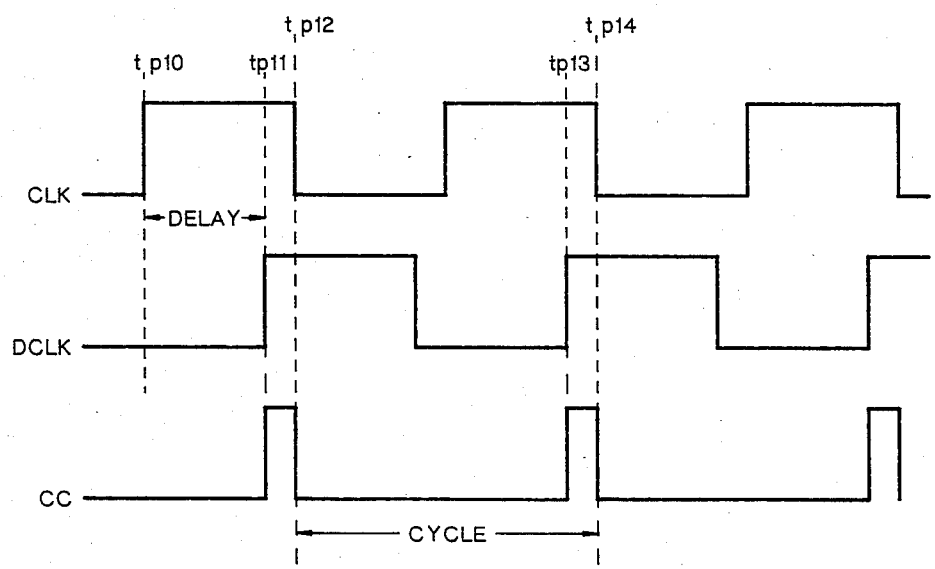

FIGS. 5 and 5b show how the clock signal can be "chopped" and illustrate the advantages of chopping. FIG. 5a depicts how the signal CLK is applied to one input of a two input NAND gate 40 and to the other input through an even number of inverters 42-45. FIG. 5b is a timing diagram for the circuit of FIG. 5a. The signal DCLK is delayed by the inverters 42-45 an amount of time equal to the time between tp10 and tp11. During the time between tp11 and tp12, both CLK and DCLK are high and the output of the NAND gate 40 will be low. This output is inverted by the inverter 41 to produce the clock signal CC. (For simplicity, circuit delays of the NAND gate 40 and inverter 41 are not shown in FIG. 5b.)

If the chopped clock CC is used instead of the square wave clock C of FIG. 1, the length of time that the clock signal is low is extended. That is, while the square wave clock C is low fifty percent of the cycle, the chopped clock, CC, in the example shown, may be low ninety percent of the cycle. It is to be noted that the chopped clock signals A and B of FIG. 2c, which signals are used in connection with operation of the scannable latch circuits described herein, could be generated from the clock signal CLK (or some other master clock signal) in a manner similar to that shown in FIG. 5a.

Using the chopped clock CC, the cycle begins at tp12 (see FIG. 5b) when the data on the input of the latch is latched into the master section and also appears on the output. The error detecting circuitry thus has the time between tp12 and tp13, while the clock CC is low, to detect any errors. At time tp13, the input is latched into the slave section of the latch and the next cycle begins at tp14. As can be seen, the chopped clock CC greatly extends the time allowed for the error detection circuitry to detect an error.

Figure 6A:
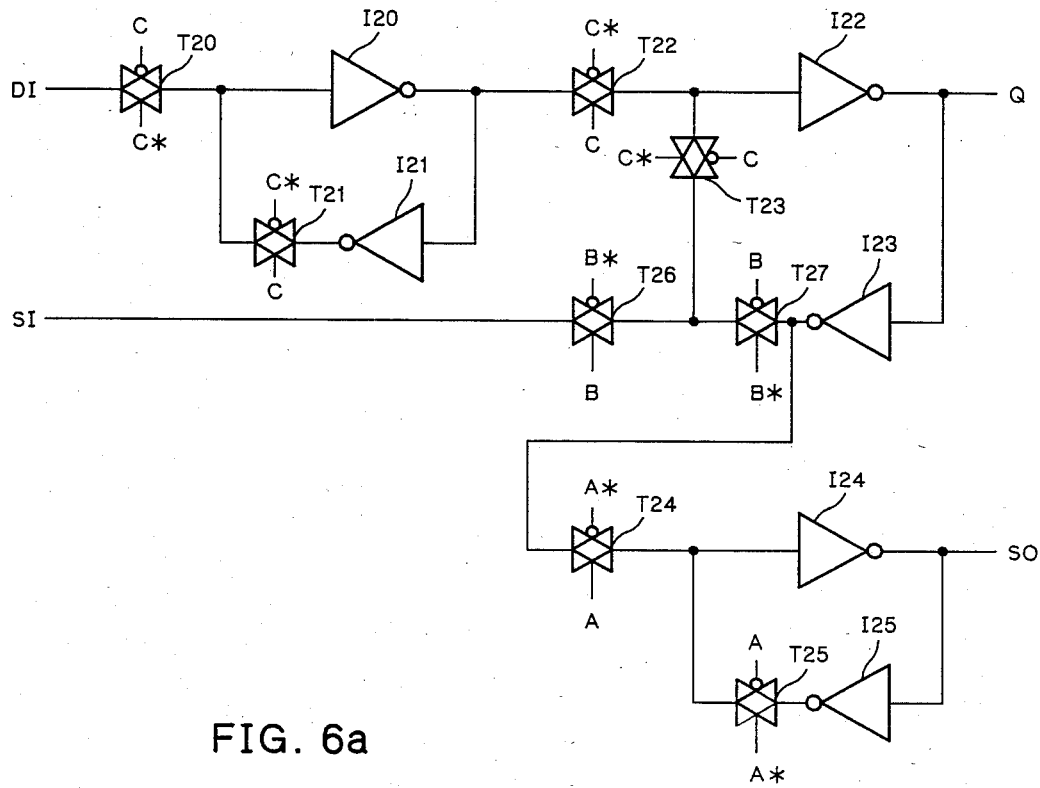
FIGS. 6a and 6b are respectively the logic drawing and timing diagram of a combination latch/shift register circuit built according to a preferred embodiment of the present invention.
Figure 6B:
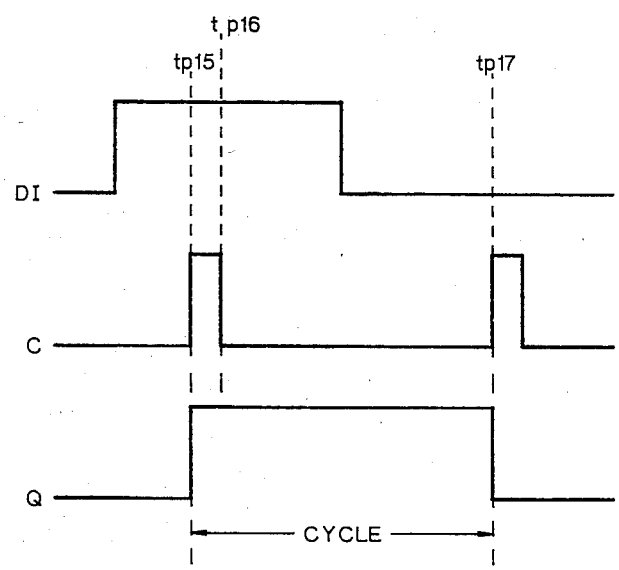

A logic drawing of an improved version of the latch of FIG. 3 is shown in FIG. 6a and the corresponding timing diagram is shown in FIG. 6b. When the circuit is used as a latch, elements T20, I20, T21 and I21 comprise the master section and elements T22, I22, T23 and I23 comprise the slave section. During this mode of operation (when the circuit is being used as a latch), the clock signals A and B are low, transmission gates T24 and T26 are turned off, and transmission gates T25 and T27 are turned on. Note that the polarities of the clock signal C on the transmission gate are the opposite from those shown on the previous latch examples of FIGS. 1, 2, and 3.

In the timing diagram shown in FIG. 6b, it is seen that prior to time tp15, the clock signal C is low and T20 is turned on. Thus, the input signal DI, inverted by I20, is at the input to T22, which is turned off. At time tp15, the clock signal goes high. Hence, T20 turns off and T21 turns on, latching the signal DI into the master section of the latch. T22 is also turned on at tp15 and the input signal DI will appear on the output Q. At time tp16, the clock signal C goes low which turns T22 off and T23 on, latching the input signal into the slave section of the latch.

The clock cycle, as shown, is the time between tp15 and tp17. The time between tp15 and tp16 is short compared to the time it takes the error detection circuitry to function. Therefore, an error could not be detected during this time in any event. Thus, this portion of the clock cycle between tp15 and tp16 is not of any consequence. On the other hand, if an error is detected between tp16 and tp17, the clock signal is low and can be stopped without causing the input to be latched into the master section of the latch. Thus, the circuit provides the entire useful cycle for the error detection circuitry to function.

When the circuit of FIG. 6a is to be used as a shift register stage, the clock signal C is held low. Transmission gate T22 is turned off and T20 is turned on. In the example of FIG. 3, the master section of the latch also served as the master section of the shift register stage since it held the data to be shifted when the clock was stopped. By contrast, in the improved circuit of FIG. 6a, when the clock is stopped, the data to be shifted is held in the slave section of the latch. Thus, the slave section of the latch becomes the master section of the shift register stage and the elements T24, I24, T25, and I25 are the slave section of the shift register.

The timing diagram of FIG. 2c, without the signal BC, also applies to the circuit of FIG. 6a when operating in the shift register mode. Clock signal A goes high, turning on T24 and transferring the data held in the master section of the shift register stage (which is the slave section of the latch) to the output SO. When clock signal A goes low, T24 is turned off, T25 is turned on, and the data is latched into the slave section of the shift register stage. Further, clock B goes high, transmission gate T26 is turned on and the input signal SI, from the output of the previous stage of the shift register, is applied to the input of the master section of the shift register stage. When clock signal B goes low, transmission gate T26 turns off, T27 turns on, and the input signal SI is latched into the master section of the shift register stage.

The improved circuit of FIG. 6a solves both of the problems that have existed with prior art latch/shift register circuits: one hundred percent of the clock cycle is effectively available to the error detection circuitry, and the output of the latch is not loaded down by the input of the next shift register stage. This improvement allows the clock cycle to be made as short as the overall delays of the system will allow without having to worry about the clock signal going from a high to low level when an error is detected.

What is claimed is:

1. An improved system for detecting and correcting errors in a computer system comprising a plurality of scannable latch circuits connected in series as a shift register circuit and each having its output coupled to combinatorial logic circuitry and error detecting circuitry, said scannable latch circuits being operable as a latch under control of at least one clock signal that defines a clock cycle, the improvement comprising:

means for isolating the latch output of each scannable latch circuit that is connected to the combinatorial logic and error detecting circuitry from the shift register output of each scannable latch circuit that is connected to the next stage of the series shift register circuit, comprising latch means coupled to the latch output of said scannable latch circuit for allowing a data signal appearing on the latch output to be selectively clocked into said latch means, said latch means having an output terminal that operates as the shift register output, whereby the latch output is not loaded down by the shift register output; and means for allowing the latch output to be monitored during substantially all of said clock cycle, comprising an asymetrical clock signal, having first and second states, supplied as said clock signal of said scannable latch circuits, said asymetrical clock signal assuming the first state for a substantially longer time period during each clock cycle than it assumes the second state, whereby errors may be detected by the error detecting circuitry for a longer time, without having to slow down said clock cycle, by detecting errors during said first state.

2. An improved system as defined in claim 1 wherein said scannable latch circuit includes a master/slave latch, the output of said master/slave latch comprising the latch output, and said master/slave latch being operable under control of said asymetrical clock signal, and further wherein the latch output assumes a data value defined by a data input signal presented to the input of said master/slave latch whenever said asymetrical clock signal changes from the second state to the first state.

3. An improved system as defined in claim 2 wherein the time period during which said asymetrical clock assumes its second state during each clock cycle is less than the time it takes said combinatorial logic and error detection circuitry to function, whereby the latch output will not change during the time said asymetrical clock assumes its first state and all of this time period, during the clock's first state, is available as useful time for error detection purposes.

4. An improved system as defined in claim 3 wherein the asymetrical clock signal assumes its first state for at least 90% of each clock cycle.

* * * * *